United States Patent
Oda

(10) Patent No.: US 7,699,948 B2
(45) Date of Patent: Apr. 20, 2010

(54) TA SPUTTERING TARGET AND METHOD FOR PREPARATION THEREOF

(75) Inventor: Kunihiro Oda, Ibaraki (JP)

(73) Assignee: Nippon Mining & Metals Co., Ltd., Tokyo (JP)

( * ) Notice: Subject to any disclaimer, the term of this patent is extended or adjusted under 35 U.S.C. 154(b) by 668 days.

(21) Appl. No.: 10/532,473

(22) PCT Filed: Jul. 29, 2003

(86) PCT No.: PCT/JP03/09574

§ 371 (c)(1),
(2), (4) Date: Apr. 22, 2005

(87) PCT Pub. No.: WO2004/044259

PCT Pub. Date: May 27, 2004

(65) Prior Publication Data

US 2005/0268999 A1    Dec. 8, 2005

(30) Foreign Application Priority Data

Nov. 13, 2002    (JP) ................. 2002-329186

(51) Int. Cl.
*C22F 1/18*    (2006.01)
(52) U.S. Cl. .................................... 148/668
(58) Field of Classification Search ................ 148/668
See application file for complete search history.

(56) References Cited

U.S. PATENT DOCUMENTS

| | | | |
|---|---|---|---|
| 4,994,118 A | 2/1991 | Pircher et al. | |
| 6,193,821 B1 | 2/2001 | Zhang | |
| 6,197,134 B1 | 3/2001 | Kanzaki et al. | |
| 6,323,055 B1 | 11/2001 | Rosenberg et al. | |
| 6,331,233 B1 * | 12/2001 | Turner | 204/298.13 |
| 6,348,113 B1 | 2/2002 | Michaluk et al. | |
| 6,348,139 B1 | 2/2002 | Shah et al. | 204/298.13 |
| 6,759,143 B2 | 7/2004 | Oda et al. | 357/67 |
| 6,770,154 B2 | 8/2004 | Koenigsmann et al. | |
| 6,893,513 B2 | 5/2005 | Michaluk et al. | |
| 7,156,963 B2 | 1/2007 | Oda | |
| 2002/0063056 A1 | 5/2002 | Shah et al. | |
| 2005/0155856 A1 | 7/2005 | Oda | 204/298.13 |
| 2007/0023281 A1 | 2/2007 | Oda | |
| 2007/0062807 A1 | 3/2007 | Oda | |
| 2007/0062806 A1 | 5/2007 | Oda | |
| 2007/0102288 A1 | 5/2007 | Oda et al. | |

FOREIGN PATENT DOCUMENTS

| | | |
|---|---|---|
| EP | 0902102 A1 | 3/1999 |
| JP | 06-264232 | 9/1994 |
| JP | 2000-239835 | 9/2000 |
| JP | 2001-271161 | 10/2001 |
| WO | WO 99/66100 | 12/1999 |

OTHER PUBLICATIONS

Patent Abstracts of Japan, 1 page English Abstract of JP 06-264232, Sep. 1994.
Patent Abstracts of Japan, 1 page English Abstract of JP 2001-271161, Oct. 2001.
Patent Abstracts of Japan, 1 page English Abstract of JP 2000-239835, Sep. 2000.
English Abstract of JP 2000-323434 A, Nov. 24, 2000.
English Abstract of JP 2000-323433 A, Nov. 24, 2000.
English Abstract of JP 61-124566 A, Jun. 12, 1986.
English Abstract of JP 01-215426 A, Aug. 29, 1989.
English Abstract of JP 09-104972 A, Apr. 22, 1997.
English Abstract of JP 2002-363662 A, Dec. 18, 2002.
English Abstract of JP 2002-363736 A, Dec. 18, 2002.
Michaluk et al., "Tantalum 101: Economics and Technology of Ta Materials", Semiconductor International, pp. 271-278, Jul. 2000.
Unpublished Co-pending U.S. Appl. No. 11/912,450.

\* cited by examiner

*Primary Examiner*—Roy King
*Assistant Examiner*—Jessee R. Roe
(74) *Attorney, Agent, or Firm*—Howson & Howson LLP

(57) ABSTRACT

A manufacturing method of a Ta sputtering target in which a Ta ingot or billet formed by melting and casting is subject to forging, annealing, rolling processing and the like to prepare a sputtering target, wherein the ingot or billet is forged and thereafter subject to recrystallization annealing at a temperature of 1373K to 1673K. As a result of improving and devising the forging process and heat treatment process, the crystal grain diameter can be made fine and uniform, and a method of stably manufacturing a Ta sputtering target superior in characteristics can be obtained thereby.

9 Claims, 2 Drawing Sheets

200μm

TA SPUTTERING TARGET AND METHOD FOR PREPARATION THEREOF

BACKGROUND OF THE INVENTION

The present invention relates to a manufacturing method of a sputtering target in which a Ta ingot or billet formed by melting and casting is subject to forging, annealing, rolling processing and the like, and to a Ta sputtering target obtained thereby.

In recent years, the sputtering method for forming a film from materials such as metal or ceramics has been used in numerous fields such as electronics, corrosion resistant materials and ornaments, catalysts, as well as in the manufacture of cutting/grinding materials and abrasion resistant materials.

Although the sputtering method itself is a well-known method in the foregoing fields, recently, particularly in the electronics field, a Ta sputtering target suitable for forming films of complex shapes and forming circuits is in demand.

Generally, this Ta target is manufactured by hot forging and annealing (heat treatment) an ingot or billet formed by performing electron beam melting and casting a Ta material, and thereafter performing rolling and finishing processing (mechanical processing, polishing, etc.) thereto. Such hot forging and annealing can be repeated. In this kind of manufacturing procedure, the hot forging performed to the ingot or billet will destroy the cast structure, disperse or eliminate the pores and segregations, and, by further annealing this, recrystallization will occur, and the precision and strength of the structure can be improved.

In this kind of manufacturing method of a target, ordinarily, recrystallization annealing is performed at a temperature of roughly 1173K (900° C.). An example of a conventional manufacturing method is described below.

Foremost, the tantalum raw material is subject to electronic beam melting and thereafter cast to prepare an ingot or billet, and subsequently subject to cold forging—recrystallization annealing at 1173K—cold forging—recrystallization annealing at 1173K—cold rolling—recrystallization annealing at 1173K—finish processing to form a target material. In this manufacturing process of a Ta target, the melted and cast ingot or billet generally has a crystal grain diameter of 50 mm or more.

As a result of subjecting the ingot or billet to hot forging and recrystallization annealing, the cast structure is destroyed, and generally even and fine (100 μm or less) crystal grains can be obtained. Nevertheless, with the conventional forging and annealing manufacturing method, there is a problem in that a pattern in the form of wrinkles or streaks is formed from the center to the peripheral edge of the disk.

FIG. 2 is a diagram showing the schematic of the target surface, and several to several ten black patterns have appeared. The micrograph of the structure of this portion of the crystal grains is shown in FIG. 3. Although there is no significant difference in the crystal grain diameter, heterophase crystal grains gathered in the form of wrinkles were observed in a part of the ordinary structure.

Generally, upon performing sputtering, finer and more uniform the crystals of the target, more even the deposition, and a film having stable characteristics with low generation of arcing and particles can be obtained.

Therefore, the existence of irregular crystal grains in the target that are generated during forging, rolling or the annealing to be performed thereafter will change the sputtering rate, and there is a problem in that evenness (uniformity) of the film will be affected, generation of arcing and particles will be promoted, and the quality of sputtered deposition may deteriorate thereby.

Further, if a forged product with stress remaining therein is used as is, the quality will deteriorate, and this must be avoided at all costs.

Accordingly, with the conventional forging and annealing process, there is a problem in that irregular crystal grains will be generated in the Ta sputtering target, and the quality of the film will deteriorate as a result thereof.

SUMMARY OF THE INVENTION

The present invention was devised in order to overcome the foregoing problems, and, as a result of improving and devising the forging process and heat treatment process, the crystal grain diameter can be made fine and uniform, and a method of stably manufacturing a Ta sputtering target superior in characteristics can be obtained.

The present invention provides:

1. A manufacturing method of a Ta sputtering target in which a Ta ingot or billet formed by melting and casting is subject to forging, annealing, rolling processing and the like to prepare a sputtering target, wherein the ingot or billet is forged and thereafter subject to recrystallization annealing at a temperature of 1373K to 1673K;
2. A manufacturing method of a Ta sputtering target according to paragraph 1 above, wherein forging and recrystallization annealing at a temperature of 1373K to 1673K are repeated at least twice;
3. A manufacturing method of a Ta sputtering target according to paragraph 1 or paragraph 2 above, wherein the recrystallization annealing after the forging or rolling conducted in the recrystallization annealing at a temperature of 1373K to 1673K is performed at a temperature between the recrystallization starting temperature and 1373K;
4. A manufacturing method of a Ta sputtering target according to any one of paragraphs 1 to 3 above, wherein, after the final rolling processing, recrystallization annealing is performed at a temperature between the recrystallization starting temperature and 1373K, and finish processing is further performed to obtain a target shape;
5. A manufacturing method of a Ta sputtering target according to paragraph 4 above, wherein, after performing rolling, crystal homogenization annealing or stress relieving annealing is performed;
6. A manufacturing method of a Ta sputtering target according to any one of paragraphs 1 to 5 above, wherein the average crystal grain diameter of the target is made to be a fine crystal grain size at 80 μm or less;
7. A manufacturing method of a Ta sputtering target according to any one of paragraphs 1 to 5 above, wherein the average crystal grain diameter of the target is made to be a fine crystal grain size at 30 to 60 μm; and
8. A manufacturing method of a Ta sputtering target according to any one of paragraphs 1 to 7 above, and a Ta sputtering method obtained with said method, wherein there is no uneven macro structure in the form of streaks or aggregates on the surface or inside the target.

DETAILED DESCRIPTION OF THE INVENTION

The sputtering target of the present invention is manufactured with the following process. To exemplify a specific example, foremost, a tantalum raw material (usually, high purity Ta of 4N5N or more is used) is melted via electronic beam melting or the like, and this is cast to prepare an ingot or billet. Next, this ingot or billet is subject to a series of processing steps including cold forging, rolling, annealing (heat treatment), finish processing and so on. Although this manufacturing process is basically the same as the conventional technology, what is particularly important is that recrystallization annealing (heat treatment) be performed at a temperature of 1373K to 1673K.

The forging performed to the ingot or billet will destroy the cast structure, disperse or eliminate the pores and segregations, and, by further annealing this, recrystallization will occur, and the precision and strength of the structure can be improved by this cold forging and recrystallization annealing. Further, when recrystallization annealing is specifically performed at a high temperature of 1373K to 1673K, it is possible to completely eliminate the pattern in the form of streaks that appeared in conventional technology.

Figure 1:
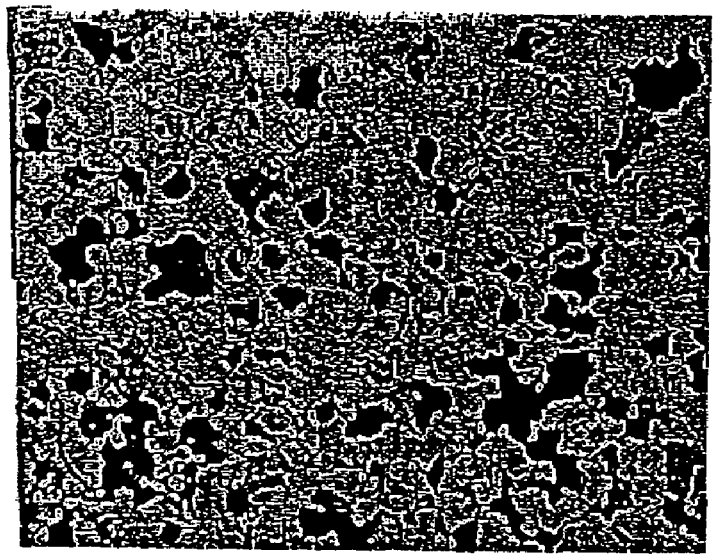
FIG. 1 is a micrograph showing the structure of the Ta target obtained by performing the forging and recrystallization annealing of the present invention.
Figure 2:
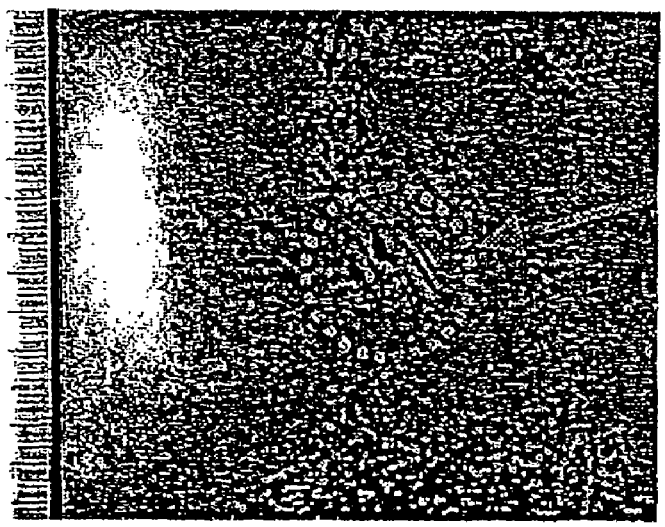
FIG. 2 is a photograph showing the schematic structure of the Ta target obtained by performing conventional forging and recrystallization annealing.

Therefore, as shown in the micrograph of the crystal grain structure on the target surface illustrated in FIG. 1, heterophase crystal grains gathered in the form of wrinkles could not be observed in the peripheral standard crystal structure, and a uniform target structure was obtained.

Upon examining the cause of the generation of heterophase crystal grains gathered in the form of wrinkles during the manufacturing process of conventional technology, even upon performing hot forging and recrystallization annealing thereafter, primary crystal grains (roughly 50 mm) remained in the ingot or billet, and with a recrystallization temperature of roughly 1173K (900° C.), it looks as though the recrystallized grains are merely generating in the primary crystal grains.

In other words, although it looks as though the primary crystal grains are crushed with the forging step and mostly eliminated, with the subsequent recrystallization temperature of roughly 1173K, the destruction of the primary crystals is incomplete, and it is considered that a part of this remains as traces of the primary crystal.

This is not eliminated even with the subsequent forging and recrystallization annealing steps, and, this is considered to become the heterophase crystal grains gathered in the form of wrinkles at the final stage of finish processing.

In light of the above, it is necessary to destroy the cast structure in the forging step, and to sufficiently perform recrystallization. Thus, in the present invention, a Ta ingot or billet formed by melting and casting is subject to forging, annealing, rolling processing and the like to prepare a sputtering target, wherein the ingot or billet is forged and thereafter subject to recrystallization annealing at a temperature of 1373K to 1673K.

As a result, it is possible to eliminate the generation of heterophase crystal grains gathered in the form of wrinkles in the Ta target, make the evenness (uniformity) of the film favorable, suppress the generation of arcing and particles, and improve the quality of the sputtered deposition.

As the standard manufacturing method of the present invention, for instance, a tantalum raw material (purity of 4N5 or more) is subject to electronic beam melting, thereafter cast to prepare an ingot or billet, this is subsequently subject to cold forging—recrystallization annealing at a temperature of 1373K to 1673K—cold forging—recrystallization annealing at a temperature of 1373K to 1673K—cold forging—recrystallization annealing at a temperature between the recrystallization starting temperature and 1373K—cold (hot) rolling—recrystallization annealing at a temperature between the recrystallization starting temperature and 1373K—finish processing to form a target material.

In the foregoing process, although the recrystallization annealing step at a temperature of 1373K to 1673K may be performed only once, by repeating this twice, the wrinkle shaped defects can be effectively reduced. With the temperature being lower than 1373K, it is difficult to eliminate the foregoing wrinkle shaped defects, and, with the temperature being higher than 1673K, abnormal grain growth will occur and the grain diameter will become uneven. Thus, it is desirable to set the temperature to be 1673K or lower.

After eliminating the foregoing wrinkle shaped defects by performing recrystallization annealing at a temperature of 1373K to 1673K, the recrystallization annealing process after forging or rolling may be performed at a temperature between the recrystallization starting temperature and 1373K.

After the final rolling process, recrystallization annealing is performed at a temperature between the recrystallization starting temperature and 1373K, and finish processing (machine processing or the like) is performed thereto to form a target shape.

As a result of performing the foregoing processes, the wrinkle shaped defects of the Ta target can be eliminated, and a Ta target superior in uniformity having fine crystal grains in which the average crystal grain diameter thereof is 80 µm or less, and even 30 to 60 µm.

EXAMPLES AND COMPARATIVE EXAMPLES

The present invention is now explained in detail with reference to the Examples. These Examples are merely illustrative, and the present invention shall in no way be limited thereby. In other words, the present invention shall only be limited by the scope of claim for a patent, and shall include the various modifications other than the Examples of this invention.

Example 1

A tantalum raw material having a purity of 99.997% was subject to electron beam melting, and this was cast to prepare an ingot or billet having a thickness of 200 mm and diameter of 200 mmφ. The crystal grain diameter in this case was approximately 55 mm. Next, after rolling this ingot or billet at room temperature, this was subject to recrystallization annealing at a temperature of 1500K. As a result, a material having a structure in which the average crystal grain diameter is 200 m, thickness of 100 mm, and diameter of 100 mmφ was obtained.

Next, this was subject to cold mix forging at room temperature once again, and recrystallization annealing was performed thereto again at a temperature of 1480K. As a result, a material having a structure in which the average crystal grain diameter is 100 µm, thickness of 100 mm, and diameter of 100 mm was obtained.

Next, this was subject to cold mix forging and recrystallization annealing at 1173K, subsequently subject to cold rolling and recrystallization annealing at 1173K once again, as well as finish processing, so as to obtain a target material having a thickness of 10 mm and diameter of 320 mmϕ.

As a result of performing the foregoing process, it was possible to obtain a Ta target superior in uniformity without any wrinkle shaped defects, and having fine crystal grains in which the average crystal grain diameter thereof is 60 µm. Further, the micrograph of this Ta target obtained in Example 1 had the same crystal structure as the Ta target shown in FIG. 1.

Upon performing sputtering with this Ta target, it was possible to improve the quality of the sputtered deposition in which the evenness (uniformity) of the film is favorable, the film thickness variation being 5% in an 8-inch wafer, and without any generation of arcing or particles.

Example 2

A tantalum raw material having a purity of 99.997% was subject to electron beam melting, and this was cast to prepare an ingot or billet having a thickness of 200 mm and diameter of 200 mmϕ. The crystal grain diameter in this case was approximately 50 mm. Next, performing cold extend forging to this ingot or billet at room temperature, this was subject to recrystallization annealing at a temperature of 1500K. As a result, a material having a structure in which the average crystal grain diameter is 200 µm, thickness of 100 mm, and diameter of 100 mmϕ was obtained.

Next, this was subject to cold mix forging at room temperature once again, and recrystallization annealing was performed thereto again at a temperature of 1173K. As a result, a material having a structure in which the average crystal grain diameter is 80 µm, thickness of 100 mm, and diameter of 100 mmϕ was obtained.

Next, this was subject to cold mix forging and recrystallization annealing at 1173K, subsequently subject to cold rolling and recrystallization annealing at 1173K once again, as well as finish processing, so as to obtain a target material having a thickness of 10 mm and diameter of 320 mmϕ.

As a result of performing the foregoing process, it was possible to obtain a Ta target superior in uniformity without any wrinkle shaped defects, and having fine crystal grains in which the average crystal grain diameter thereof is 35 µm. Further, the micrograph of this Ta target obtained in Example 2 had the same crystal structure as the Ta target shown in FIG. 1.

Upon performing sputtering with this Ta target, it was possible to improve the quality of the sputtered deposition in which the evenness (uniformity) of the film is favorable, the film thickness variation being 5% in an 8-inch wafer, and without any generation of arcing or particles.

Example 3

A tantalum raw material having a purity of 99.997% was subject to electron beam melting, and this was cast to prepare an ingot or billet having a thickness of 200 mm and diameter of 300 mmϕ. The crystal grain diameter in this case was approximately 50 mm. Next, after performing cold extend forging to this ingot or billet at room temperature, this was subject to recrystallization annealing at a temperature of 1500K. As a result, a material having a structure in which the average crystal grain diameter is 250 µm, thickness of 100 mm, and diameter of 100 mmϕ was obtained.

Next, this was subject to cold mix forging at room temperature once again, and recrystallization annealing was performed thereto again at a temperature of 1173K. As a result, a material having a structure in which the average crystal grain diameter is 80 µm, thickness of 100 mm, and diameter of 100 mmϕ was obtained.

Next, this was subject to cold mix forging and recrystallization annealing at 1173K, subsequently subject to cold rolling and recrystallization annealing at 1173K once again, as well as finish processing, so as to obtain a target material having a thickness of 10 mm and diameter of 320 mmϕ.

As a result of performing the foregoing process, it was possible to obtain a Ta target superior in uniformity without any wrinkle shaped defects, and having fine crystal grains in which the average crystal grain diameter thereof is 50 µm. Further, the micrograph of this Ta target obtained in Example 3 had the same crystal structure as the Ta target shown in FIG. 1.

Upon performing sputtering with this Ta target, it was possible to improve the quality of the sputtered deposition in which the evenness (uniformity) of the film is favorable, the film thickness variation being 6% in an 8-inch wafer, and without any generation of arcing or particles.

Comparative Example 1

As with Example 1, a tantalum raw material having a purity of 99.997% was subject to electron beam melting, and this was cast to prepare an ingot or billet having a thickness of 200 mm and diameter of 200 mmϕ. The crystal grain diameter in this case was approximately 55 mm. Next, after performing cold mix forging to this ingot or billet at room temperature, this was subject to recrystallization annealing at a temperature of 1173K. As a result, a material having a structure in which the average crystal grain diameter is 180 µm, thickness of 100 mm, and diameter of 100 mmϕ was obtained.

Next, this was subject to cold mix forging at room temperature once again, and recrystallization annealing was performed thereto again at a temperature of 1173K. As a result, a material having a structure in which the average crystal grain diameter is 80 µm, thickness of 100 mm, and diameter of 100 mmϕ was obtained.

Next, this was subject to cold rolling and recrystallization annealing at 1173K, as well as finish processing, so as to obtain a target material having a thickness of 10 mm and diameter of 320 mmϕ.

Figure 3:
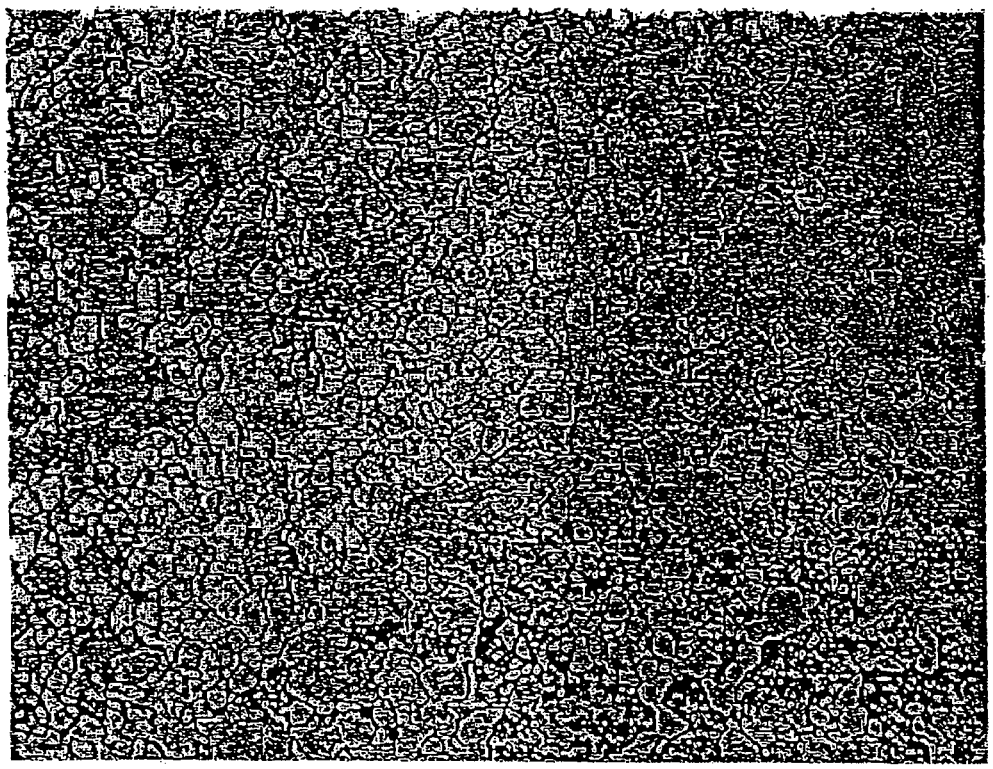
FIG. 3 is a micrograph showing the structure of the Ta target obtained by performing conventional forging and recrystallization annealing.

Numerous traces in the form of wrinkles were observed from the center to the periphery of the Ta target obtained with the foregoing process, and the result was a Ta target having a heterophase crystal structure. Further, the micrograph of the Ta target obtained in Comparative Example 1 had the same crystal structure as the Ta target shown in FIG. 3.

Upon performing sputtering with this Ta target, it deteriorated the quality of the sputtered deposition in which the evenness (uniformity) of the film is inferior, the film thickness variation being 10% in an 8-inch wafer, and with the generation of arcing or particles.

The present invention yields a superior effect in the manufacturing method of a Ta sputtering target as a result of adjusting the crystal grains by performing forging, recrystallization annealing, rolling processing and the like to the ingot or billet material, eliminating the generation of heterophase crystal grains gathered in the form of wrinkles in the target, making the evenness (uniformity) of the film favorable, suppressing the generation of arcing and particles, and improving the quality of the sputtered deposition.

The invention claimed is:

1. A method of manufacturing a Ta sputtering target, comprising the steps of:

forming a Ta ingot or billet having a predetermined diameter by melting and casting a Ta raw material having a purity of 4N5 (99.995%) or greater;

cold extend forging the ingot or billet such that the predetermined diameter is reduced, and after said cold extend forging step, recrystallization annealing the ingot or billet a first time at a temperature of 1373K to 1673K;

after said cold extend forging and first recrystallization annealing steps, cold mix forging the ingot or billet and then recrystallization annealing the ingot or billet a second time at a temperature of 1373K to 1673K; and after said cold mix forging and second recrystallization annealing steps, further cold mix forging the ingot or billet, and thereafter, conducting additional recrystallization annealing of the ingot or billet at a temperature between a recrystallization starting temperature and 1373K;

an average crystal grain diameter of the target being made to be a fine crystal grain size of 80 μm or less and the target being made to have no uneven macrostructure in the form of streaks or aggregates on a surface of the target and inside of the target.

2. A method according to claim 1, wherein said additional recrystallization annealing conducted after said further cold mix forging step is conducted at a temperature of 1173K.

3. A method according to claim 2, wherein said fine crystal grain size of the sputtering target is 30 to 60 μm.

4. A method according to claim 1, wherein said melting of the Ta raw material in said forming step is electron beam melting.

5. A method according to claim 4, wherein the Ta ingot or billet produced by said forming step has primary crystal grains of a diameter of roughly 50 mm.

6. A method according to claim 1, wherein said cold mix forging and second recrystallization annealing steps completely eliminate all heterophase and irregular crystal grains from the Ta ingot or billet.

7. A method according to claim 6, further comprising, after said additional recrystallization annealing step, the steps of cold rolling the Ta ingot or billet, and thereafter, conducting recrystallization annealing of the Ta ingot or billet for a fourth time at a temperature between a recrystallization starting temperature and 1373K.

8. A method according to claim 7, further comprising, after said fourth recrystallization annealing step, the step of forming a sputtering target from the Ta ingot or billet such that said target has an average crystal grain diameter of a fine crystal grain size of 80 μm or less and has no uneven macrostructure in the form of streaks, aggregates, and wrinkle shaped defects on a surface of the target and inside of the target due to the previous elimination of all heterophase and irregular crystal grains from the Ta ingot or billet.

9. A method according to claim 1, wherein the diameter of the ingot or billet is unchanged during said cold mix forging step.

* * * * *

UNITED STATES PATENT AND TRADEMARK OFFICE
CERTIFICATE OF CORRECTION

PATENT NO. : 7,699,948 B2  Page 1 of 1
APPLICATION NO. : 10/532473
DATED : April 20, 2010
INVENTOR(S) : Kunihiro Oda It is certified that error appears in the above-identified patent and that said Letters Patent is hereby corrected as shown below:

Column 4, line 58, --is 200m,-- should read --is 200μm,--

Column 4, line 65, --100 mm-- should read --100 mmΦ--

Signed and Sealed this

Twelfth Day of October, 2010

David J. Kappos
*Director of the United States Patent and Trademark Office*